(12) United States Patent
Fujihara et al.

(10) Patent No.: US 11,467,208 B2
(45) Date of Patent: Oct. 11, 2022

(54) CONTACT RELEASE METHOD IN INSPECTION APPARATUS AND INSPECTION APPARATUS

(71) Applicant: TOKYO ELECTRON LIMITED, Tokyo (JP)

(72) Inventors: Jun Fujihara, Yamanashi (JP); Kentaro Konishi, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 17/347,325

(22) Filed: Jun. 14, 2021

(65) Prior Publication Data

US 2021/0396803 A1    Dec. 23, 2021

(30) Foreign Application Priority Data

Jun. 19, 2020    (JP) .............................. JP2020-106054

(51) Int. Cl.

| G01R 31/00 | (2006.01) |
|---|---|
| G01R 31/26 | (2020.01) |
| G01R 31/28 | (2006.01) |
| G01R 1/04 | (2006.01) |
| G01R 1/067 | (2006.01) |
| G01R 1/073 | (2006.01) |
| G01R 35/00 | (2006.01) |

(52) U.S. Cl.
CPC ..... *G01R 31/2887* (2013.01); *G01R 1/07342* (2013.01)

(58) Field of Classification Search
CPC ........ G01R 31/00; G01R 31/26; G01R 31/28; G01R 1/04; G01R 1/067; G01R 1/073; G01R 35/00
See application file for complete search history.

(56) References Cited

U.S. PATENT DOCUMENTS

| 11,099,236 B2 * | 8/2021 | Hyakudomi ....... G01R 31/2891 |
| 2019/0331731 A1 * | 10/2019 | Yamada ............. G01R 31/2887 |

FOREIGN PATENT DOCUMENTS

JP    2014-075420 A    4/2014

* cited by examiner

*Primary Examiner* — Neel D Shah
(74) *Attorney, Agent, or Firm* — Fenwick & West LLP

(57) ABSTRACT

A method for releasing contact between probes and a substrate is provided. In a state where the probes are pressed against the substrate to be in contact with the substrate, a pressure is reduced in an inspection space that is surrounded by a substrate support having thereon the substrate, a tubular member attracting and holding the substrate support through a seal member, and a frame to which a probe card is fixed. The method includes raising an alignment mechanism to a predetermined position to be close to the substrate support, subsequently stopping the pressure reduction of the inspection space and supporting the substrate support by the alignment mechanism located at the predetermined position while preventing release of the contact, subsequently lowering the alignment mechanism supporting the substrate support to release the contact, and subsequently stopping the attracting and holding of the substrate support by the tubular member.

11 Claims, 7 Drawing Sheets

CONTACT RELEASE METHOD IN INSPECTION APPARATUS AND INSPECTION APPARATUS

CROSS-REFERENCE TO RELATED APPLICATIONS

This application claims priority to Japanese Patent Application No. 2020-106054, filed on Jun. 19, 2020, the entire contents of which are incorporated herein by reference.

TECHNICAL FIELD

The present disclosure relates to a contact release method in an inspection apparatus, and the inspection apparatus.

BACKGROUND

Japanese Patent Application Publication No. 2014-75420 discloses a wafer inspection apparatus including a transfer stage for transferring a plurality of testers and a wafer. In the wafer inspection apparatus disclosed in Japanese Patent Application Publication No. 2014-75420, an extensible/contractible bellows is disposed to surround a probe card of the tester, and the wafer is placed on a chuck top that is a thick plate member. Further, the chuck top is supported by the transfer stage, and the transfer stage is made to face the probe card together with the wafer and the chuck top. Then, the transfer stage is moved toward the probe card to bring the chuck top into contact with the bellows. Even after the chuck top is brought into contact with the bellows, the transfer stage is moved toward the probe card together with the wafer and the chuck top to bring the wafer into contact with the probe card.

SUMMARY

The technique of the present disclosure prevents, in the case of inspecting a substrate by pressing probes to be in contact with the substrate, long contact marks from being generated when the contact between the substrate and the probes is released without reducing a pressing force.

In accordance with an aspect of the present disclosure, there is provided a method for releasing contact between probes for inspection and a substrate in an inspection apparatus for inspecting the substrate, the inspection apparatus including: a plate-shaped substrate support on which the substrate is placed; an alignment mechanism configured to hold and move the substrate support to align a position between the substrate placed on the substrate support and the probes; and an extensible/contractible tubular member that is suspended from a frame to surround a probe card, the probe card having the probes and being fixed to the frame, a pressure being reduced in an inspection space that is surrounded by the substrate support, the tubular member, and the frame in a state where the probes are pressed against the substrate to be in contact with the substrate, and the substrate support being attracted and held by the tubular member through an elastic seal member. The method includes: raising the alignment mechanism to a predetermined position to be close to the substrate support forming the inspection space; subsequently stopping the pressure reduction of the inspection space and supporting the substrate support by the alignment mechanism located at the predetermined position while preventing release of the contact between the substrate and the probes pressed against the substrate; subsequently lowering the alignment mechanism supporting the substrate support to release the contact between the substrate and the probes pressed against the substrate; and subsequently stopping the attracting and holding of the substrate support by the tubular member through the seal member.

BRIEF DESCRIPTION OF THE DRAWINGS

The objects and features of the present disclosure will become apparent from the following description of embodiments, given in conjunction with the accompanying drawings, in which.

DETAILED DESCRIPTION

In a semiconductor manufacturing process, a plurality of semiconductor devices, each having a predetermined circuit pattern, is formed on a semiconductor wafer (hereinafter, referred to as "wafer"). Electrical characteristics of the semiconductor devices formed on the wafer are inspected and the semiconductor devices are classified into non-defective products or defective products. For example, the semiconductor devices on the wafer are inspected with an inspection apparatus before the wafer is divided into the semiconductor devices.

The inspection apparatus includes a probe card having a plurality of probes that are needle-shaped contact terminals. In order to perform the electrical characteristic inspection, first, the wafer and the probe card are made to be close to each other, and the probes of the probe card are brought into contact with electrodes of the semiconductor devices formed on the wafer. Then, electric signals are supplied from a tester disposed above the probe card to the semiconductor devices through the probes. The defectiveness of the semiconductor devices is determined based on the electric signals transmitted from the semiconductor devices to the tester through the probes.

Figure 1:
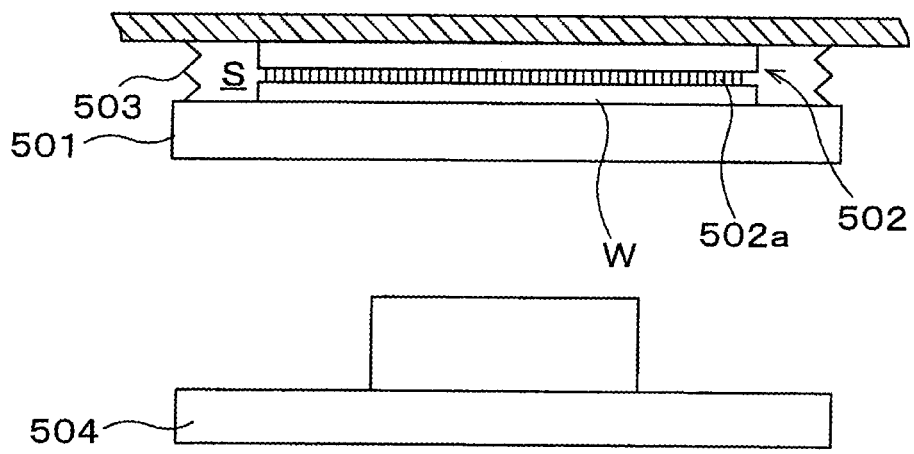
FIG. 1 shows a conventional inspection apparatus.

As an example of the inspection apparatus, an inspection apparatus shown in FIG. 1 has been suggested (see, e.g., Japanese Patent Application Publication No. 2014-75420). The inspection apparatus shown in FIG. 1 includes a plate-shaped chuck top 501 on which a wafer W is placed, a bellows 503 that surrounds a space between the chuck top 501 and a probe card 502 to form a sealed space S, and an aligner 504 for holding and moving the chuck top 501 to align a position of the wafer W with respect to probes 502*a* of the probe card 502. In this inspection apparatus, the chuck top 501 is supported by the aligner 504 when the probes 502*a* and the wafer W are brought into contact with each other. However, during the inspection, the chuck top 501 is separated from the aligner 504 and supported by the bellows 503.

Further, in the inspection apparatus as shown in FIG. 1, in order to bring the wafer W into contact with the probes 502a, first, the aligner 504 supporting the chuck top 501 is raised to bring the wafer W into contact with the probes 502a. Then, the aligner 504 is further raised so that the probes 502a are pressed against, and in contact with, the wafer W by a desired pressing force. Further, in order to maintain the state in which the probes 502a are pressed against, and in contact with, the wafer W by the desired pressing force even when the chuck top 501 and the aligner 504 are separated from each other during the inspection, a pressure in the sealed space S formed by the bellows 503 is reduced.

However, in the inspection apparatus shown in FIG. 1, after the completion of the inspection, the contact between the probes 502a and the wafer W is released by opening the sealed space S formed by the bellows 503 to the atmosphere, for example. At this time, a reaction force from the probes 502a may act on a position deviated from the center of the wafer W. Further, a moment may be generated around the center of the chuck top 501, which makes the chuck top 501 be tilted. If the chuck top 501 is tilted a large amount, long contact marks of the probes 502a are generated on a part of the wafer W during the tilting of the chuck top 501. Accordingly, the semiconductor devices formed on the wafer W may be damaged by the probes 502a. Although it is possible to prevent the generation of long contact marks by reducing the pressing force of the probes 502a applied to the wafer W, the inspection may not be appropriately performed in the case of reducing the pressing force.

Therefore, the technique of the present disclosure prevents, in the case of inspecting the wafer by pressing the probes to be in contact with the wafer, long contact marks from being generated without reducing the pressing force when the contact between the wafer and the probes is released.

Hereinafter, a contact release method in an inspection apparatus and the inspection apparatus of the present embodiment will be described with reference to the accompanying drawings. Like reference numerals will be given to like parts substantially having the same functions and configurations throughout this specification and the drawings, and redundant description thereof will be omitted.

Figure 2:
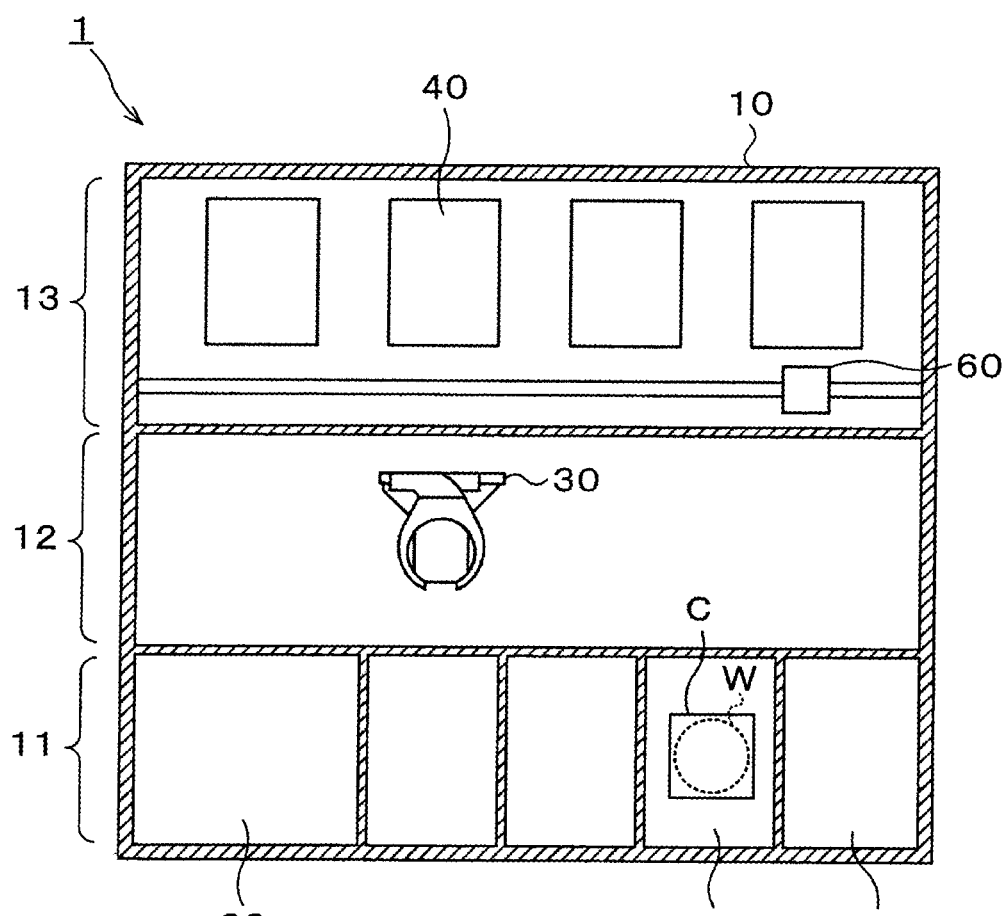
FIG. 2 is a horizontal cross-sectional top view showing a schematic configuration of an inspection apparatus according to an embodiment.
Figure 3:
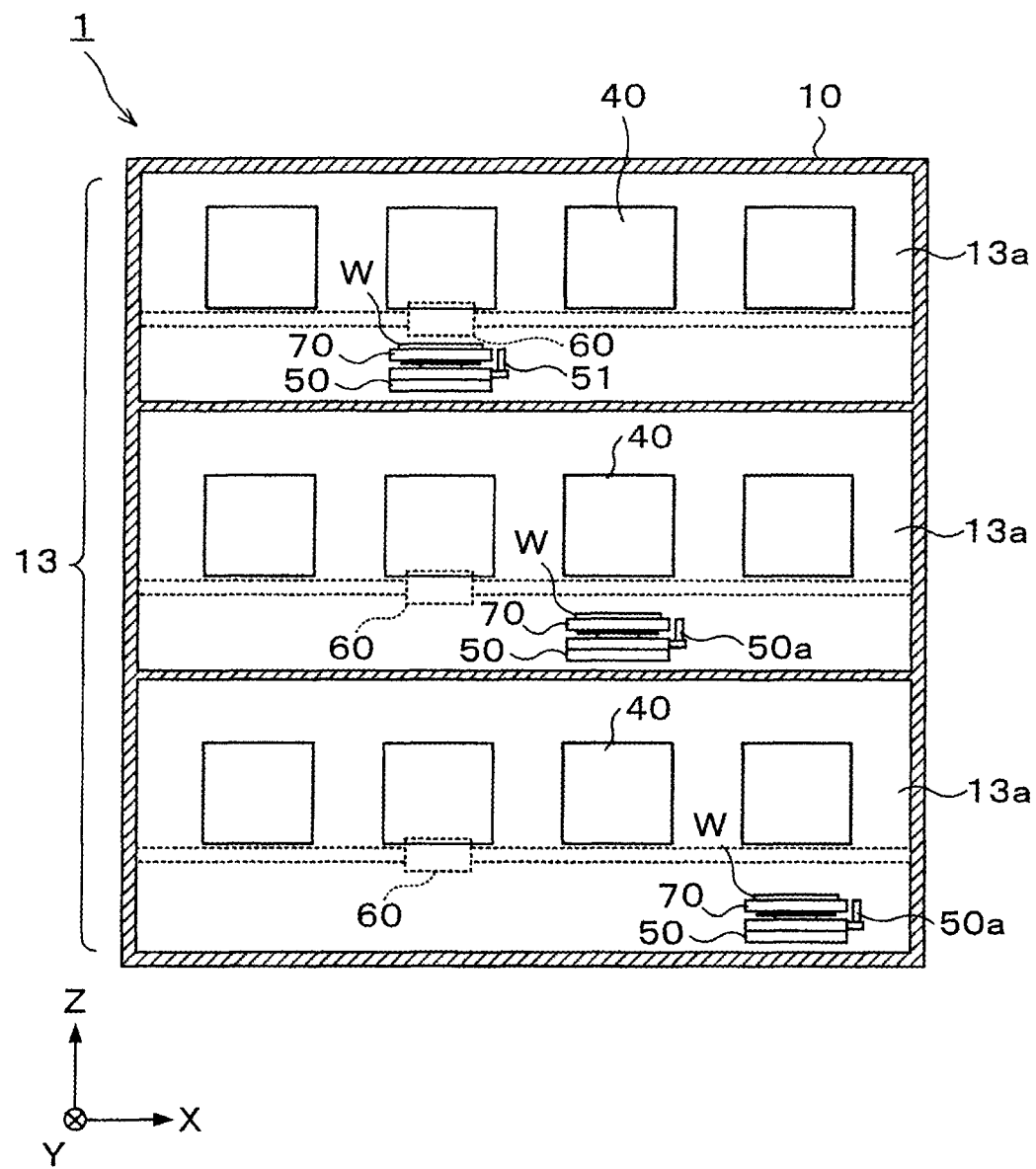
FIG. 3 is a vertical cross-sectional front view showing the schematic configuration of the inspection apparatus according to the embodiment.

FIGS. 2 and 3 are a horizontal cross-sectional view and a vertical cross-sectional view, respectively, each schematically showing a configuration of the inspection apparatus of the present embodiment.

The inspection apparatus 1 shown in FIGS. 2 and 3 inspects the wafer W serving as a substrate. Specifically, the inspection apparatus 1 inspects the electrical characteristics of the semiconductor devices that are inspection target devices formed on the wafer W. The inspection apparatus 1 includes a housing 10 having a loading/unloading area 11, a transfer area 12, and an inspection area 13. In the loading/unloading area 11, the wafer W is loaded into and unloaded from the inspection apparatus 1. The transfer area 12 is formed to connect the loading/unloading area 11 and the inspection area 13. In the inspection area 13, electrical characteristics of the semiconductor devices formed on the wafer W are inspected.

The loading/unloading area 11 has therein a port 20 for receiving a cassette C containing a plurality of wafers W, a loader 21 accommodating a probe card to be described later, and a controller 22 for controlling individual components of the inspection apparatus 1. The controller 22 is, for example, a computer including a CPU, a memory, and the like, and includes a program storage unit (not shown). The program storage unit is configured to store programs for controlling various processes in the inspection apparatus 1. The programs may be stored in a computer-readable storage medium and installed in the controller 22 from the storage medium. A part or all of the programs may be realized by a dedicated hardware (circuit board).

A transfer device 30 configured to be movable while holding the wafer W or the like is disposed in the transfer area 12. The transfer device 30 transfers the wafer W between the cassette C in the port 20 of the loading/unloading area 11 and the inspection area 13. Further, the transfer device 30 transfers, among probe cards fixed to a pogo frame to be described later in the inspection area 13, a probe card requiring maintenance to the loader 21 in the loading/unloading area 11. In addition, the transfer device 30 transfers a new probe card or a probe card that has been subjected to the maintenance from the loader 21 to the pogo frame in the inspection area 13.

A plurality of testers 40 is disposed in the inspection area 13. Specifically, as shown in FIG. 3, the inspection area 13 is vertically divided into three areas 13a, and a plurality of (four in the example shown in FIG. 3) testers 40 is horizontally arranged in a tester row (X direction in FIG. 3) in each of the vertically divided areas 13a. One aligner 50 serving as an alignment mechanism and one camera 60 are disposed in each of the vertically divided areas 13a. In other words, one aligner 50 and one camera 60 are commonly used for the plurality of testers 40 in each of the vertically divided areas 13a. Since a probe card is provided for each tester 40 as will be described later, one aligner 50 and one camera 60 are commonly used for the plurality of probe cards. However, the number and arrangement of the tester 40, the aligner 50, and the camera 60 may be arbitrarily selected.

Each of the testers 40 transmits and receives electric signals for electrical characteristic inspection to and from the wafer W. The aligner 50 is configured to hold and move the chuck top 70 serving as a substrate support on which the wafer W is placed in a right-left direction (X direction in FIG. 2), a forward-backward direction (Y direction in FIG. 2), and a vertical direction (Z direction in FIG. 2). Therefore, the aligner 50 can align the position between the wafer W placed on the chuck top 70 and the probes of the probe card to be described later. Further, the aligner 50 is provided with a camera 50a that captures an image of the probe card to be described later.

The camera 60 moves horizontally and reaches a position in front of each tester 40 in the vertically divided area 13a where the camera 60 is disposed to capture an image of the wafer W placed on the chuck top 70 on the aligner 50.

The imaging result of the camera 60 and the imaging result of the camera 50a provided at the aligner 50 are used for aligning the position between the probes of the probe card and the electrodes of the semiconductor devices formed on the wafer W placed on the chuck top 70.

The chuck top 70 can hold the wafer W placed thereon by, for example, vacuum attraction.

In this inspection apparatus 1, while the transfer device 30 is transferring one wafer W toward one tester 40, another tester 40 can inspect the electrical characteristics of the electronic devices formed on a different wafer W.

Figure 4:
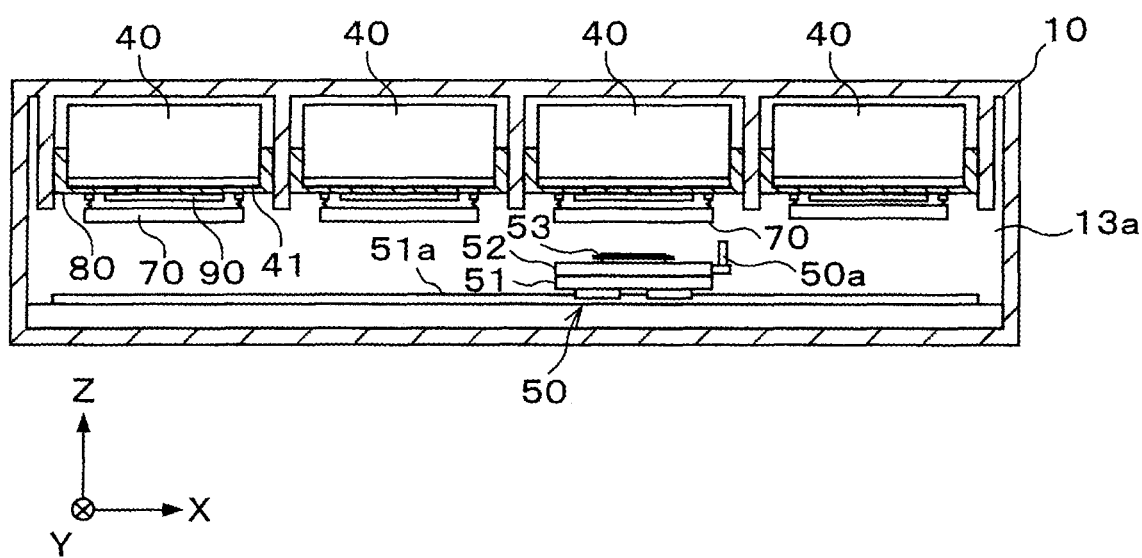
FIG. 4 is a vertical cross-sectional front view showing a configuration in each vertically divided region.
Figure 5:
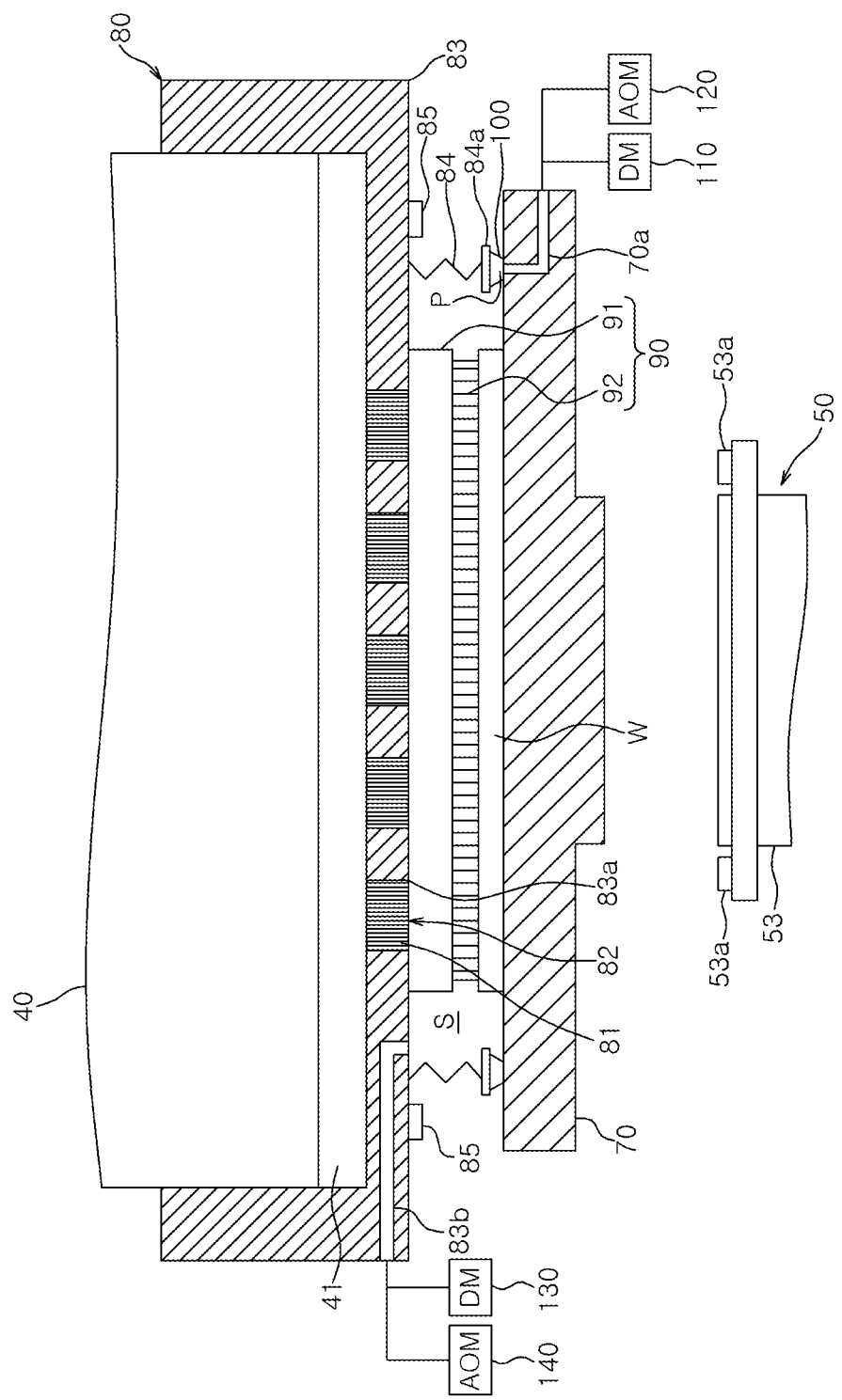
FIG. 5 is a partially enlarged view of FIG. 4.

Next, a configuration of the aligner 50 and a configuration around each tester 40 will be described with reference to FIGS. 4 and 5. FIG. 4 is a vertical cross-sectional front view showing a configuration in each divided area 13a. FIG. 5 is a partially enlarged view of FIG. 4.

As shown in FIG. 4, the aligner 50 has, for example, an X stage 51, a Y stage 52, and a Z stage 53. The X stage 51 moves in a right-left direction (X direction in FIG. 4) along a guide rail 51a. The Y stage 52 moves on the X stage 51 in a forward-backward direction (Y direction in FIG. 4). The Z stage 53 moves in a vertical direction (Z direction in FIG. 4) with respect to the Y stage 52. Further, the chuck top 70 is detachably attracted and held on the Z stage 53. The chuck top 70 is attracted and held on the Z stage 53 by, for example, vacuum attraction force of an attraction holding mechanism (not shown).

With this configuration, the aligner 50 holds and moves the chuck top 70 on which the wafer W is placed in the right-left direction (X direction in FIG. 4), the forward-backward direction (Y direction in FIG. 4), and the vertical direction (Z direction in FIG. 4).

As shown in FIG. 5, a plurality of displacement sensors 53a is disposed on the Z stage 53 of the aligner 50. The displacement sensors 53a are used, for example, to detect the position of the aligner 50 with respect to the chuck top 70. The displacement sensors 53a detect a distance between the aligner 50 and the chuck top 70. Specifically, the displacement sensors 53a detect the distance between an upper surface of the Z stage 53 of the aligner 50 (i.e., a surface on which the chuck top 70 is held) and a bottom surface of the chuck top 70.

Further, the aligner 50 is provided with a tilting adjustment mechanism (not shown) for adjusting a relative tilt between the aligner 50 and the chuck top 70.

The aligner 50 is controlled by the controller 22, and the detection results of the displacement sensors 53a are outputted to the controller 22.

As shown in FIG. 5, each tester 40 has a tester motherboard 41 that is horizontally disposed on a bottom surface of the tester 40. A plurality of test circuit boards (not shown) is mounted upright on the tester motherboard 41. A plurality of electrodes (not shown) is disposed at a bottom surface of the tester motherboard 41.

One pogo frame 80 and one probe card 90 are disposed under the tester 40, in that order, from the upper side.

The pogo frame 80 supports the probe card 90 and electrically connects the probe card 90 with the tester 40. The pogo frame 80 is disposed between the tester 40 and the probe card 90. The pogo frame 80 has multiple pogo pins 81 for electrically connecting the tester 40 and the probe card 90. Specifically, the pogo frame 80 has pogo blocks 82 holding the pogo pins 81. Further, the pogo frame 80 includes a frame body 83 having insertion holes 83a into which the pogo blocks 82 holding the pogo pins 81 are inserted.

The probe card 90 whose position has been aligned to a predetermined position is supported on a bottom surface of the pogo frame 80.

By using an exhaust unit (not shown), the tester motherboard 41 is coupled to the pogo frame 80 by vacuum attraction force and the probe card 90 is coupled to the pogo frame 80 by vacuum attraction force. Due to the vacuum attraction force, the lower ends of the pogo pins 871 of the pogo frame 80 are brought into contact with the corresponding electrode pads on the top surface of a card body 91 (to be described later) of the contactor 80, and the upper ends of the pogo pins 81 are pressed against the corresponding electrodes on the bottom surface of the tester motherboard 41.

The probe card 90 includes the disc-shaped card body 91 having multiple electrode pads on an upper surface of the card body 91. Multiple probes 92 that are needle-shaped contact terminals extending downward are disposed at a bottom surface of the card body 91.

The electrode pads disposed on the upper surface of the card body 91 are electrically connected to the corresponding probes 92. At the time of inspection, the probes 92 are respectively brought into contact with the electrodes of the semiconductor devices formed on the wafer W. Therefore, at the time of the electrical characteristic inspection, electrical signals for inspection are transmitted and received between the tester motherboard 41 and the semiconductor devices on the wafer W through the pogo pins 81, the electrode pads disposed on the upper surface of the card body 91, and the probes 92.

Further, in the inspection apparatus 1, the plurality of probes 92 are disposed to cover substantially the entire bottom surface of the card body 91 in order to simultaneously inspect the electrical characteristics of the semiconductor devices formed on the wafer W.

Further, a bellows 84 that is a tubular member is attached to the bottom surface of the pogo frame 80. The bellows 84 is an extensible/contractible tubular member that is suspended from the bottom surface of the pogo frame 80 and surrounds the probe card 90. An annular contact portion 84a is disposed at the lower end of the bellows 84.

The bellows 84 is configured to attract and hold the chuck top 70 by vacuum attraction force through a lip seal 100 as a seal member at a position below the probe card 90.

The lip seal 100 is an elastic member and is made of, e.g., a resin material. The lip seal 100 is disposed on an upper surface of the chuck top 70 to surround the wafer W placed on the chuck top 70 and to face the bellows 84. The lip seal 100 is opened upward and is brought into contact with the contact portion 84a of the bellows 84. The lip seal 100 forms an airtight space P surrounded by the lip seal 100 and the bellows 84. Specifically, the lip seal 100 forms the airtight space P surrounded by the lip seal 100 and the contact portion 84a of the bellows 84. The airtight space P communicates with one end of an exhaust passage 70a formed in the chuck top 70. A decompressing mechanism (DM) 110 and an atmosphere opening mechanism (AOM) 120 are connected to the other end of the exhaust passage 70a.

The decompressing mechanism 110 is configured to reduce a pressure in the airtight space P. Accordingly, the chuck top 70 is attracted and held by the bellows 84 by vacuum attraction force through the lip seal 100. In other words, the decompressing mechanism 110 generates the vacuum attraction force for attracting and holding the chuck top 70 by the bellows 84 through the lip seal 100. The decompressing mechanism 110 may include a vacuum pump for exhausting the airtight space P, and a switching valve for switching the start and stop of the exhaust operation using the vacuum pump. The decompressing mechanism 110 is controlled by the controller 22.

The atmosphere opening mechanism 120 is a mechanism for separating the chuck top 70 from the bellows 84, i.e., a mechanism for stopping the attracting and holding of the chuck top 70 by the bellows 84. The atmosphere opening mechanism 120 is configured to introduce the atmosphere into the airtight space P. The atmosphere opening mechanism 120 may include a switching valve for switching the start and stop of the introduction of the atmosphere into the airtight space P. The atmosphere opening mechanism 120 is controlled by the controller 22.

In order to separate the chuck top 70 from the bellows 84, an inert gas or the like may be introduced instead of the atmosphere.

Further, the bellows 84 attracts and holds the chuck top 70 by vacuum attraction force through the lip seal 100 to form the sealed space S surrounded by the pogo frame 80 to which the probe card 90 is fixed, the bellows 84, the lip seal 100, and the chuck top 70. The sealed space S communicates with one end of an exhaust passage 83b formed in the frame body 83 of the pogo frame 80. A decompressing mechanism (DM) 130 and an atmosphere opening mechanism (AOM) 140 are connected to the other end of the exhaust passage 83b.

The decompressing mechanism 130 is configured to reduce a pressure in the sealed space S. Accordingly, the contact state between the wafer W and the probes 92 is maintained. The decompressing mechanism 130 may include a vacuum pump for exhausting the sealed space S, and a switching valve for switching the start and stop of the exhaust operation using the vacuum pump. The decompressing mechanism 130 is controlled by the controller 22.

The atmosphere opening mechanism 140 is a mechanism for returning a pressure in the sealed space S to an atmospheric pressure. Thus, the atmosphere opening mechanism 140 introduces the atmosphere into the sealed space S. The atmosphere opening mechanism 140 may include a switching valve for switching the start and stop of the introduction of the atmosphere into the airtight space P. The atmosphere opening mechanism 140 is controlled by the controller 22.

In order to return the pressure in the sealed space S to the atmospheric pressure, an inert gas or the like may be introduced instead of the atmosphere.

A plurality of displacement sensors 85 is provided on a bottom surface of the frame body 83 of the pogo frame 80 to detect the position of the chuck top 70 with respect to the pogo frame 80. The displacement sensors 85 detect a distance from the pogo frame 80 to the chuck top 70. Specifically, the displacement sensors 85 detect the distance from the displacement sensors 85 to the upper surface of the chuck top 70. The detection results of the displacement sensors 85 are outputted to the controller 22.

Next, an inspection process using the inspection apparatus 1 will be described.

(Loading and Alignment)

First, the wafer W that is an inspection target is loaded, and the wafer W and the probe card 90 are aligned.

Specifically, the controller 22 controls the transfer device 30 or the like to transfer the wafer W from the cassette C in the port 20 of the loading/unloading area 11 into the inspection area 13 and place the wafer W on the chuck top 70 that is attracted and held by the aligner 50. Next, the controller 22 controls the aligner 50 based on the imaging result of the wafer W on the chuck top 70 obtained by the camera 60 and the imaging result of the probes 92 obtained by the camera 50a to perform horizontal position alignment between the wafer W on the chuck top 70 and the probes 92.

(Attracting and Holding of the Chuck Top 70 and Pressing Contact of the Probes 92)

Next, the chuck top 70 is attracted and held by the bellows 84 by vacuum attraction force and the probes 92 are pressed to be in contact with the wafer W.

Specifically, for example, the chuck top 70 is raised by raising the Z stage 53 of the aligner 50 that attracts and holds the chuck top 70 by vacuum attraction force, so that the contact portion 84a of the bellows 84 and the lip seal 100 are brought into contact with each other. Accordingly, the airtight space P surrounded by the contact portion 84a and the lip seal 100 is formed. Next, the pressure in the airtight space P is reduced by the decompressing mechanism 110, so that the chuck top 70 is attracted and held by the bellows 84 by vacuum attraction force through the lip seal 100, and the sealed space S surrounded by the pogo frame 80, the bellows 84, the lip seal 100, and the chuck top 70 is formed.

Next, the chuck top 70 is further raised by raising the Z stage 53 of the aligner 50 to bring the probes 92 of the probe card 90 into contact with the electrodes of the semiconductor devices formed on the wafer W.

Even after the probes 92 and the electrodes are in contact with each other, the chuck top 70 is further raised by raising the Z stage 53 of the aligner 50, so that the probes 92 are pressed to be in contact with the electrodes of the wafer W on the chuck top 70. The raised amount of the chuck top 70 after the probes 92 and the electrodes of the wafer W are brought into contact with each other is hereinafter referred to as "overdrive amount." Next, the pressure in the sealed space S is reduced to a predetermined pressure by the decompressing mechanism 130, and the chuck top 70 is coupled to the probe card 90 by vacuum attraction force.

Next, the attracting and holding of the chuck top 70 by the Z stage 53 of the aligner 50 is released, and the Z stage 53 is lowered. At this time, since the pressure in the sealed space S is reduced to the predetermined pressure, the chuck top 70 is continuously coupled to the probe card 90 by vacuum attraction force even after the chuck top 70 is separated from the Z stage 53. Therefore, the probes 92 are continuously in contact with the electrodes of the wafer W on the chuck top 70 while being pressed thereagainst. At this time, the pressure reduction of the airtight space P is continued and, thus, the sealed space S can be reliably sealed.

(Inspection)

After the chuck top 70 is separated from the Z stage 53 of the aligner 50, electrical signals for inspecting electrical characteristics are inputted from the tester 40 to the probes 92 through the pogo pins 81 and the like, and the inspection of electrical characteristics of the electronic devices formed on the wafer W is performed.

(Release of Contact of the Probes 92 and Separation of the Chuck Top 70)

When the inspection of electrical characteristics is completed, the contact between the inspected wafer W and the probes 92 is released, and the chuck top 70 on which the inspected wafer W is placed is separated from the bellows 84 and supported by the aligner 50. A method for releasing the contact between the wafer W and the probes 92 (hereinafter, referred to as "contact release/removal method") including the separation of the chuck top 70 from the bellows 84 will be described in detail later.

(Unloading)

Next, the inspected wafer W is unloaded.

Specifically, the controller 22 controls the transfer device 30 to transfer the inspected wafer W on the chuck top 70 that is attracted and held by the aligner 50 from the inspection area 13 to the cassette C in the port 20 of the loading/unloading area 11.

Further, during the inspection in one tester 40, the aligner 50 transfers a wafer W that is another inspection target to a different tester 40 or collects another inspected wafer W from a different tester 40.

Figure 6:
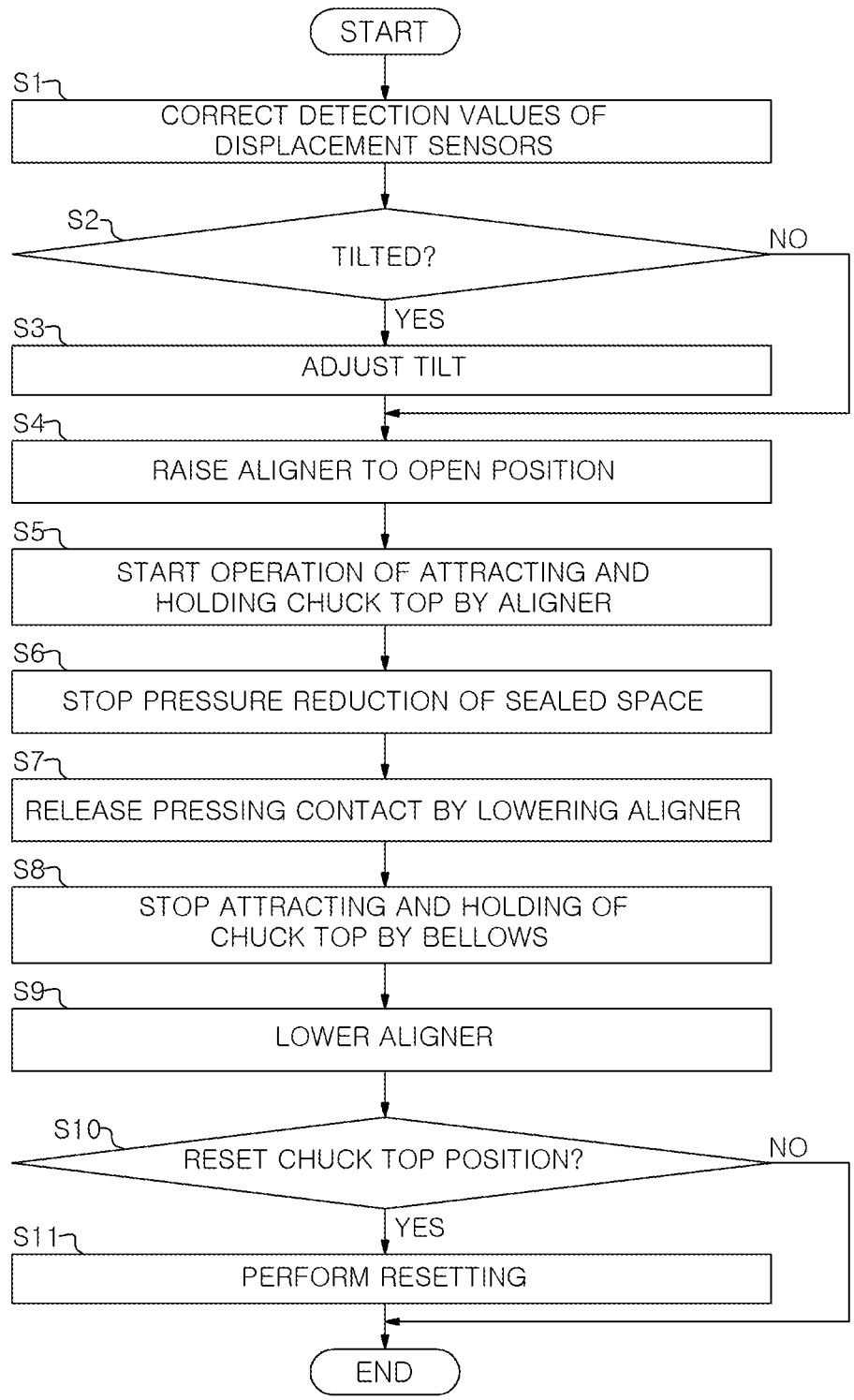
FIG. 6 is a flowchart for explaining an example of a contact release method according to the embodiment.

Next, the contact release/separation method will be described with reference to FIGS. 6 and 7A to 7D. FIG. 6 is a flowchart for explaining an example of the contact release/separation method. FIGS. 7A to 7D shows states of the chuck top 70, the aligner 50, or the like in steps of the contact release/separation method.

In this example, since the detection results of the displacement sensors 53a are used, first, the detection values obtained by the displacement sensors 53a are corrected (step S1).

Specifically, the Z stage 53 of the aligner 50 is moved by moving the X stage 51 and the Y stage 52 to a space below the chuck top 70 held by the bellows 84. Then, the Z stage 53 is raised by a predetermined amount Δh (e.g., 100 μm). The distance from the upper surface of the Z stage 53 of the aligner 50 to the bottom surface of the chuck top 70 is detected by the displacement sensors 53a before and after the Z stage 53 is raised, and the controller 22 corrects the detection values of the displacement sensors 53a based on the detection results and the raised amount of the Z stage 53, i.e., the predetermined amount Δh. There are multiple displacement sensors 53a, and the correction is performed for each displacement sensor 53a.

Next, it is determined whether or not the aligner 50 and the chuck top 70 are relatively tilted (step S2).

Specifically, for example, the controller 22 controls the displacement sensors 53a to detect the distance from the upper surface of the Z stage 53 of the aligner 50 to the bottom surface of the chuck top 70, and calculates a value for the relative tilt between the Z stage 53 of the aligner 50 and the chuck top 70 based on the detection results. Then, the controller 22 determines whether or not the calculated value exceeds a predetermined value.

If it is determined that the calculated value exceeds the predetermined value (that is, when the aligner 50 and the chuck top 70 are relatively tilted) (YES in step S2), the tilting adjustment mechanism (not shown) provided at the aligner 50 is used to adjust the relative tilt between the aligner 50 and the chuck top 70 (step S3). If the calculated value does not exceed the predetermined value (that is, when the aligner 50 and the chuck top 70 are not relatively tilted) (NO in step S2), the tilting adjustment process of step S3 is omitted.

Figure 7A:
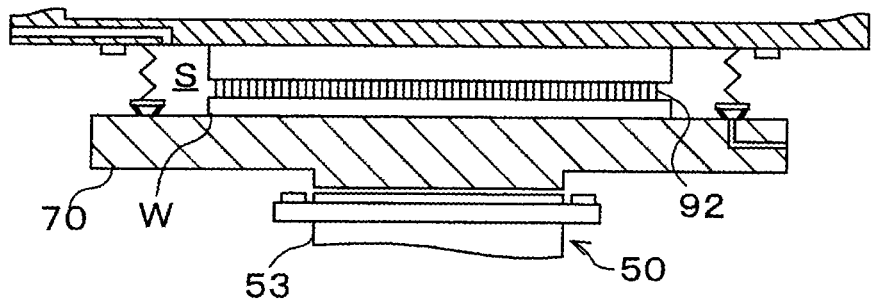
FIGS. 7A to 7D show states of a chuck top, an aligner, and the like in steps of the contact release method according to the embodiment.

Next, as shown in FIG. 7A, the aligner 50 is raised to a predetermined open position and becomes close to the chuck top 70 forming the sealed space S (step S4).

Specifically, the Z stage 53 of the aligner 50 is gradually raised to the open position so that the upper surface of the Z stage 53 becomes gradually close to the bottom surface of the chuck top 70 forming the sealed space S. The open position is, for example, a position where a distance L from the upper surface of the Z stage 53 of the aligner 50 to the bottom surface of the chuck top 70 detected by each displacement sensor 53a is smaller than the overdrive amount OD, more specifically a position where the distance L is 60 μm or less, and more preferably a position where the distance L is 30 μm or less.

Next, the operation of attracting and holding the chuck top 70 by the aligner 50 is started (step S5).

Specifically, the controller 22 controls the attraction holding mechanism (not shown) provided at the aligner 50 to start the operation of attracting and holding the chuck top 70 by the Z stage 53 of the aligner 50. Since, however, the chuck top 70 is separated from the Z stage 53 at this moment, the chuck top 70 is not actually attracted and held by the Z stage 53.

Next, the pressure reduction of the sealed space S is stopped, and the pressure in the sealed space S is returned to the atmospheric pressure (step S6).

Specifically, the controller 22 controls the decompressing mechanism 110 and the atmosphere opening mechanism 120 to stop the pressure reduction of the sealed space S surrounded by the pogo frame 80 to which the probe card 90 is fixed, the bellows 84, the lip seal 100, and the chuck top 70, and open the sealed space S to the atmosphere through the exhaust passage 83b.

Figure 7B:
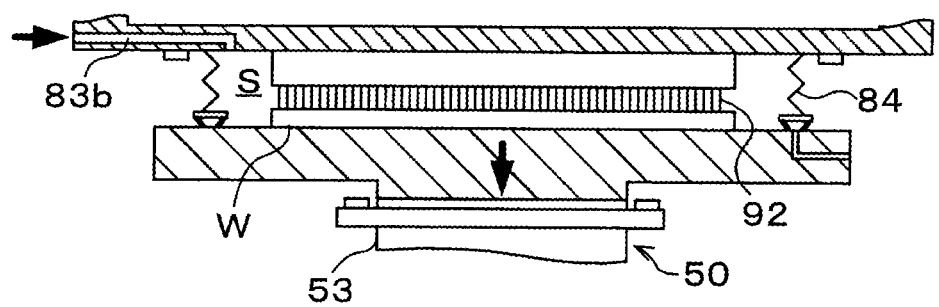

At this time, the chuck top 70 and the wafer W placed on the chuck top 70 are lowered, as shown in FIG. 7B, due to the reaction force and the weight of the probes 92 pressed against the wafer W. Since, however, the Z stage 53 of the aligner 50 is located at the open position, the Z stage 53 and the chuck top 70 are close enough to prevent the release of the contact between the wafer W and the probes 92 pressed against the wafer W, even if the sealed space S is opened to the atmosphere. Therefore, even if a moment is generated around the center of the chuck top 70 by opening the sealed space S to the atmosphere, the chuck top 70 is supported on the Z stage 53 without being tilted a large amount.

When the chuck top 70 is supported on the Z stage 53, the chuck top 70 is attracted and held by the Z stage 53 because the attracting and holding operation is already started as described above. Further, the chuck top 70 is still attracted and held by the bellows 84 by vacuum attraction force through the lip seal 100.

Figure 7C:
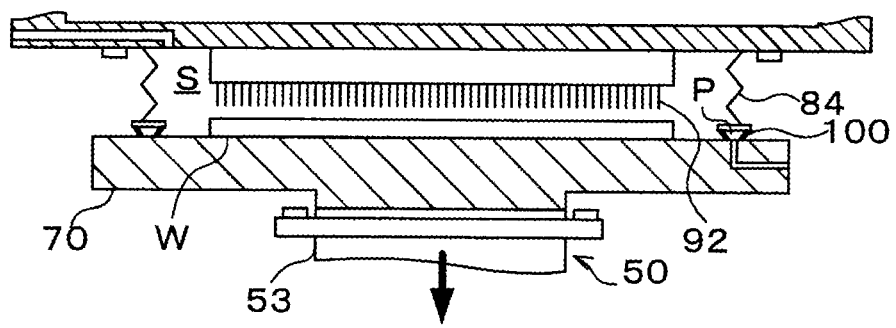

Next, the Z stage 53 of the aligner 50 that attracts and holds the chuck top 70 is lowered to release the contact between the wafer W and the probes 92 pressed against the wafer W, as shown in FIG. 7C (step S7).

At this time, the lowered amount of the Z stage 53 exceeds at least the overdrive amount OD, and is, e.g., about 200 μm to 500 μm. Accordingly, the contact between the wafer W and the probes 92 pressed against the wafer W can be reliably released, and more specifically, the wafer W and the probes 92 can be reliably separated from each other.

The lowered amount of the Z stage 53 in step S7 is preferably set in consideration of the warpage of the probe card 90 or the like.

Figure 7D:
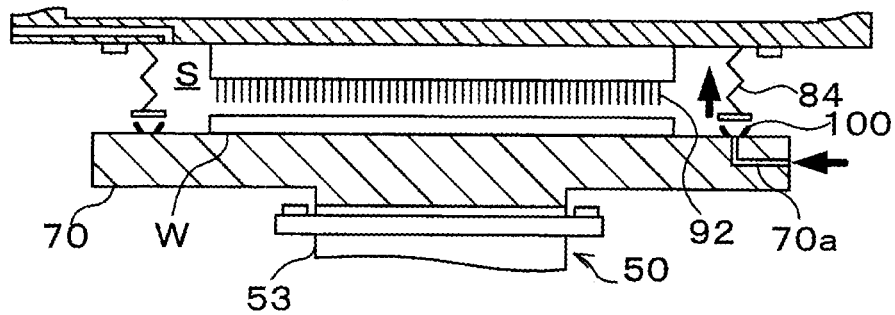

Next, the attracting and holding of the chuck top 70 by the bellows 84 through the lip seal 100 is stopped, and the chuck top 70 is separated from the bellows 84, as shown in FIG. 7D (step S8).

Specifically, the controller 22 controls the decompressing mechanism 130 and the atmosphere opening mechanism 140 to stop the pressure reduction of the airtight space P surrounded by the lip seal 100 and the bellows 84, and return the pressure in the airtight space P to the atmospheric pressure through the exhaust passage 70a. Accordingly, the attracting and holding of the chuck top 70 by the bellows 84 through the lip seal 100 is released, and the chuck top 70 is separated from the bellows 84 and supported only by the Z stage 53 of the aligner 50.

Then, the controller 22 lowers the Z stage 53 of the aligner 50 to a predetermined position.

When the attracting and holding of the chuck top 70 by the bellows 84 through the lip seal 100 is released, the chuck top 70 may be moved horizontally, i.e., shifted horizontally, due to the reaction force from the lip seal 100 deformed during the attracting and holding operation. Even if the chuck top 70 is shifted horizontally as described above, the probes 92 do not slide on the wafer W because the wafer W and the probes 92 are separated by executing step S7. Therefore, long contact marks caused by the probes 92 are not formed on the wafer W due to the reaction force from the lip seal 100.

Next, the Z stage 53 of the aligner 50 that attracts and holds the chuck top 70 is further lowered (step S9).

Then, it is determined whether or not to reset the position of the chuck top 70 (step S10).

Specifically, for example, the controller 22 calculates a value for the tilting of the chuck top 70 held by the Z stage 53 of the aligner 50 with respect to the Z stage 53 based on the detection results of the displacement sensors 53a, and determines whether or not the calculated value for the tilting of the chuck top 70 exceeds the predetermined value.

If it is determined that the calculated value exceeds the predetermined value (that is, when the chuck top 70 is tilted without being placed at a desired position on the Z stage 53) (YES in step S10), an operation of resetting the position of the chuck top 70 is performed (step S11). The reset operation is, for example, an operation of vibrating at least one of the X stage 51 and the Y stage 52. When the calculated value of the chuck top 70 does not exceed the predetermined value (that is, when the chuck top 70 is not tilted) (NO in step S10), the reset process of step S11 is omitted.

As described above, the method for releasing the contact between the probes 92 and the wafer W of the present embodiment includes the step of raising the aligner 50 to a predetermined release position (aforementioned open position) to allow the aligner 50 to be close to the chuck top 70 that forms the sealed space S and is attracted and held by the bellows 84, and the step of stopping the pressure reduction of the sealed space S and supporting the chuck top 70 by the aligner 50 located at the release position to prevent the release of the contact between the wafer W and the probes 92 pressed against the wafer W. Therefore, even if a moment is generated around the center of the chuck top 70 by opening the sealed space S to the atmosphere, the chuck top 70 is supported by the Z stage 53 without being tilted a large amount. Accordingly, when the sealed space S is opened to the atmosphere, the relative movement of the probes 92 does not occur in a large amount along the upper surface of the wafer W held by the chuck top 70. In other words, when the sealed space S is opened, long contact marks caused by the probes 92 are not formed on the wafer W.

The method of the present embodiment further includes, after the step of supporting the chuck top 70 by the aligner 50, a step of lowering the aligner 50 that attracts and holds the chuck top 70 to release the contact between the wafer W and the probes 92 pressed against the wafer W, and then stopping the attracting and holding of the chuck top 70 by the bellows 84 through the lip seal 100. In other words, in the method of the present embodiment, the attracting and holding of the chuck top 70 by the bellows 84 through the lip seal 100 is released in a state where the wafer W and the probes 92 are separated from each other. Therefore, when the attracting and holding is released, even if the chuck top 70 is shifted horizontally with respect to the probes 92 due to the reaction force of the lip seal 100, long contact marks caused by the probes 92 are not formed on the wafer W placed on the chuck top 70.

As described above, in accordance with the present embodiment, it is possible to prevent long contact marks from being generated when the contact between the wafer W and the probes is released. Further, it is not necessary to reduce the pressing force of the probes 502a against the wafer W to prevent the generation of the long contact marks.

In the above example, in step S4, the aligner 50 is gradually raised to the open position where the distance L from the upper surface of the Z stage 53 of the aligner 50 to the bottom surface of the chuck top 70 detected by each displacement sensors 53a is smaller than or equal to a predetermined value. Instead, for example, in step S4, the aligner 50 is raised in a stepwise manner to an open position that is a position where variation of the distance L detected by each displacement sensor becomes smaller than a raised amount in a first step. Further, in step S4, the aligner 50 is gradually raised to an open position where the distance from the pogo frame 80 to the chuck top 70 detected by each displacement sensor 85 is changed (e.g., several μm).

Further, in the above example, the lip seal 100 is disposed on the upper surface of the chuck top 70. The lip seal may be disposed at the bottom surface of the contact portion 84a of the bellows 84. In this case as well, the chuck top 70 can be attracted and held by the bellows 84 through the lip seal by reducing the pressure in the sealing space surrounded by the lip seal and the upper surface of the chuck top 70 in contact with the lip seal.

In the above example, the chuck top 70 is attracted and held by the bellows 84 through the lip seal 100 by vacuum attraction force. Instead, for example, the attracting and holding may be performed by electrostatic attraction between the contact portion 84a of the bellows 84 and the upper surface of the chuck top 70.

The presently disclosed embodiments are considered in all respect to be illustrative and not restrictive. The above-described embodiments can be embodied in various forms. Further, the above-described embodiments may be omitted, replaced, or changed in various forms without departing from the scope of the appended claims and the gist thereof.

The invention claimed is:

1. A method for releasing contact between probes for inspection and a substrate in an inspection apparatus for inspecting the substrate, the inspection apparatus including:
 a plate-shaped substrate support on which the substrate is placed;
 an alignment mechanism configured to hold and move the substrate support to align a position between the substrate placed on the substrate support and the probes; and
 an extensible/contractible tubular member that is suspended from a frame to surround a probe card, the probe card having the probes and being fixed to the frame,
 a pressure being reduced in an inspection space that is surrounded by the substrate support, the tubular member, and the frame in a state where the probes are pressed against the substrate to be in contact with the substrate, and the substrate support being attracted and held by the tubular member through an elastic seal member, the method comprising:
 raising the alignment mechanism to a predetermined position to be close to the substrate support forming the inspection space;
 subsequently stopping the pressure reduction of the inspection space and supporting the substrate support by the alignment mechanism located at the predetermined position while preventing release of the contact between the substrate and the probes pressed against the substrate;
 subsequently lowering the alignment mechanism supporting the substrate support to release the contact between the substrate and the probes pressed against the substrate; and
 subsequently stopping the attracting and holding of the substrate support by the tubular member through the seal member.

2. The contact release method of claim 1, wherein a plurality of probe cards, each of which is the probe card of claim 1, is provided in the inspection apparatus, and the alignment mechanism is commonly used for the probe cards.

3. The contact release method of claim 2, wherein in said raising the alignment mechanism to the predetermined position to be close to the substrate support, the alignment mechanism is raised to the predetermined position based on a detection result obtained by a sensor configured to detect a position of the alignment mechanism with respect to the substrate support.

4. The contact release method of claim 3, wherein the sensor is used for adjusting a relative tilt between the alignment mechanism and the substrate support.

5. The contact release method of claim 2, wherein in said raising the alignment mechanism to the predetermined position to be close to the substrate support, the alignment mechanism is raised to the predetermined position based on a detection result obtained by a sensor configured to detect a position of the substrate support with respect to the frame to which the probe card is fixed.

6. The contact release method of claim 5, wherein when the substrate support is raised to press the probes to be in contact with the substrate, the alignment mechanism further raises the substrate support after the probes are in contact with the substrate, and
 the predetermined position is a position where a distance from the alignment mechanism to the substrate support becomes smaller than a raised amount of the substrate support after the probes are in contact with the substrate.

7. The contact release method of claim 1, wherein in said raising the alignment mechanism to the predetermined position to be close to the substrate support, the alignment mechanism is raised to the predetermined position based on a detection result obtained by a sensor configured to detect a position of the alignment mechanism with respect to the substrate support.

8. The contact release method of claim 7, wherein the sensor is used for adjusting a relative tilt between the alignment mechanism and the substrate support.

9. The contact release method of claim 1, wherein in said raising the alignment mechanism to the predetermined position to be close to the substrate support, the alignment mechanism is raised to the predetermined position based on a detection result obtained by a sensor configured to detect a position of the substrate support with respect to the frame to which the probe card is fixed.

10. The contact release method of claim 1, wherein when the substrate support is raised to press the probes to be in contact with the substrate, the alignment mechanism further raises the substrate support after the probes are in contact with the substrate, and
 the predetermined position is a position where a distance from the alignment mechanism to the substrate support becomes smaller than a raised amount of the substrate support after the probes are in contact with the substrate.

11. An inspection apparatus for inspecting a substrate, comprising:
 a plate-shaped substrate support on which the substrate is placed;
 an alignment mechanism configured to hold and move the substrate support to align a position between the substrate placed on the substrate support and probes for inspection;
 an extensible/contractible tubular member that is suspended from a frame to surround a probe card, the probe card having the probes and being fixed to the frame,
 a decompressing mechanism configured to reduce a pressure in an inspection space surrounded by the substrate support, the tubular member, and the probe card;
 an attracting and holding mechanism configured to generate an attracting force for attracting and holding the substrate support by the tubular member through an elastic seal member; and
 a controller;
 wherein the controller outputs control signals to execute:
 raising the alignment mechanism to a predetermined position to be close to the substrate support forming the inspection space when the substrate support is attracted and held by the tubular member through the seal portion by reducing the pressure in the inspection space in a state where the probes are pressed to be in contact with the substrate;
 subsequently stopping the pressure reduction of the inspection space and supporting the substrate support by the alignment mechanism located at the predetermined position while preventing release of the contact between the substrate and the probes pressed against the substrate;
 subsequently lowering the alignment mechanism supporting the substrate support to release the contact between the substrate and the probes pressed against the substrate; and
 subsequently stopping the attracting and holding of the substrate support by the tubular member through the seal member.

* * * * *